(12) United States Patent
Naumann

(10) Patent No.: US 10,126,129 B2
(45) Date of Patent: Nov. 13, 2018

(54) VIBRATION AND SHOCK ROBUST GYROSCOPE

(71) Applicant: FREESCALE SEMICONDUCTOR, INC., Austin, TX (US)

(72) Inventor: Michael Naumann, Burgstaedt (DE)

(73) Assignee: NXP USA, Inc., Austin, TX (US)

( * ) Notice: Subject to any disclaimer, the term of this patent is extended or adjusted under 35 U.S.C. 154(b) by 196 days.

(21) Appl. No.: 15/207,229

(22) Filed: Jul. 11, 2016

(65) Prior Publication Data

US 2018/0010913 A1   Jan. 11, 2018

(51) Int. Cl.
G01C 19/5733 (2012.01)
G01C 19/5719 (2012.01)
G01C 19/5747 (2012.01)

(52) U.S. Cl.
CPC ..... *G01C 19/5719* (2013.01); *G01C 19/5747* (2013.01)

(58) Field of Classification Search
CPC ............ G01C 19/5719; G01C 19/1733; G01C 19/174; G01C 19/5747
See application file for complete search history.

(56) References Cited

U.S. PATENT DOCUMENTS

| 6,843,127 B1* | 1/2005 | Chiou | G01C 19/5719 73/504.12 |
| 8,869,616 B1* | 10/2014 | Sridharamurthy | G01C 19/5747 73/514.12 |
| 2002/0189354 A1* | 12/2002 | Durante | G01C 19/5747 73/504.12 |
| 2006/0272410 A1* | 12/2006 | Mao | G01C 19/5719 73/504.02 |
| 2008/0078246 A1 | 4/2008 | Li | |
| 2009/0256297 A1* | 10/2009 | Geisberger | G01P 15/125 267/160 |

(Continued)

FOREIGN PATENT DOCUMENTS

| EP | 2884229 A1 | 6/2015 |
| WO | WO-2015/090542 A1 | 6/2015 |

OTHER PUBLICATIONS

Schofield, Adam R. et al; "Multi-Degree of Freedom Tuning Fork Gyroscope Demonstrating Shock Rejection"; 2007 IEEE Sensors Conference ; pp. 120-123 (2007).

*Primary Examiner* — Peter J Macchiarolo
*Assistant Examiner* — Alexander A Mercado
(74) *Attorney, Agent, or Firm* — Charlene R. Jacobsen

(57) ABSTRACT

A MEMS device includes a movable mass having a central region overlying a sense electrode and an opening in which a suspension structure and spring system are located. The suspension structure includes an anchor coupled to a substrate and rigid links extending from opposing sides of the anchor. The spring system includes a first and second spring heads coupled to each of the rigid links. A first drive spring is coupled to the first spring head and to the movable mass, and a second drive spring is coupled to the second spring head and to the movable mass. The movable mass is resiliently suspended above the surface of the substrate via the suspension structure and the spring system. The spring system enables drive motion of the movable mass in the drive direction and sense motion of the movable mass in a sense direction perpendicular to the surface of the substrate.

20 Claims, 5 Drawing Sheets

(56) References Cited

U.S. PATENT DOCUMENTS

| | | | |
|---|---|---|---|
| 2010/0037690 A1* | 2/2010 | Gunthner | G01C 19/5712 73/504.04 |
| 2010/0058864 A1* | 3/2010 | Hsu | G01P 15/125 73/514.32 |
| 2010/0083756 A1* | 4/2010 | Merz | G01C 19/5712 73/504.12 |
| 2010/0281977 A1* | 11/2010 | Coronato | G01C 19/5712 73/504.14 |
| 2011/0132087 A1* | 6/2011 | Ohms | G01C 19/5747 73/504.12 |
| 2011/0265566 A1* | 11/2011 | Acar | G01C 19/5712 73/504.12 |
| 2011/0308314 A1* | 12/2011 | Kempe | G01C 19/574 73/504.02 |
| 2012/0011933 A1* | 1/2012 | Ohms | G01C 19/5747 73/504.02 |
| 2012/0186346 A1* | 7/2012 | McNeil | G01P 15/125 73/514.32 |
| 2012/0210788 A1* | 8/2012 | Gunther | G01C 19/574 73/504.12 |
| 2013/0104651 A1 | 5/2013 | Li et al. | |
| 2013/0176825 A1* | 7/2013 | Heitz | G01C 19/5747 367/179 |
| 2013/0192362 A1 | 8/2013 | Rytkönen | |
| 2013/0192363 A1 | 8/2013 | Loreck et al. | |
| 2014/0116136 A1 | 5/2014 | Coronato et al. | |
| 2014/0144231 A1 | 5/2014 | Lin et al. | |
| 2014/0230549 A1 | 8/2014 | McNeil et al. | |
| 2014/0254007 A1* | 9/2014 | Ma | G02B 27/2214 359/464 |
| 2014/0260610 A1* | 9/2014 | McNeil | G01C 19/5712 73/504.12 |
| 2014/0267331 A1* | 9/2014 | Villarreal | G02B 26/02 345/531 |
| 2015/0033849 A1 | 2/2015 | Hanson et al. | |
| 2015/0068308 A1 | 3/2015 | Blomqvist et al. | |
| 2015/0145075 A1* | 5/2015 | Mahameed | B81B 3/0021 257/415 |
| 2015/0316378 A1* | 11/2015 | Kergueris | G01C 19/5747 73/504.12 |
| 2015/0325180 A1* | 11/2015 | Silva | G09G 3/3433 345/690 |
| 2015/0330783 A1* | 11/2015 | Rocchi | G01C 19/5747 73/504.12 |
| 2016/0069683 A1* | 3/2016 | Furuhata | G01C 19/574 73/504.12 |
| 2016/0130133 A1* | 5/2016 | Boillot | B81B 3/0048 73/504.12 |
| 2016/0231115 A1* | 8/2016 | Piirainen | G01C 19/5747 |
| 2016/0231116 A1* | 8/2016 | Piirainen | G01C 19/5747 |
| 2016/0265916 A1* | 9/2016 | Kergueris | G01C 19/5747 |
| 2016/0363445 A1* | 12/2016 | Anac | B81B 3/0051 |
| 2016/0370182 A1* | 12/2016 | Shao | G01C 19/5769 |
| 2017/0089945 A1* | 3/2017 | Naumann | G01P 15/125 |
| 2017/0350701 A1* | 12/2017 | Geisberger | G01C 19/5747 |
| 2018/0031602 A1* | 2/2018 | Huang | G01C 19/5719 |

\* cited by examiner

VIBRATION AND SHOCK ROBUST GYROSCOPE

TECHNICAL FIELD OF THE INVENTION

The present invention relates generally to microelectromechanical systems (MEMS) devices. More specifically, the present invention relates to a MEMS device, such as an angular rate sensor, that is vibration and shock robust.

BACKGROUND OF THE INVENTION

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensor devices are widely used in applications such as automotive, inertial guidance systems, household appliances, game devices, protection systems for a variety of devices, and many other industrial, scientific, and engineering systems. In particular, MEMS gyro sensors are increasingly being adapted for use in the automotive industry to facilitate antiskid control and electronic stability control in antirollover systems.

A MEMS gyro sensor, alternatively referred to as a "gyroscope," "angular rate sensor", "gyrometer," "gyroscope sensor," or "yaw rate sensor," is an inertial sensor that senses angular speed or velocity around one or more axes. One such sensor, referred to as an "x-axis" gyro, is configured to sense angular rotation about an axis parallel to the gyro substrate due to the influence of a Coriolis acceleration component. Many MEMS gyro sensors utilize vibrating structures that are suspended over a substrate. One such angular rate sensor is commonly referred to as a "tuning fork" angular rate sensor and typically has electrostatic drive and capacitive-type sensing. Unfortunately, such gyro sensors can be susceptible to disturbances such as shock and vibration. That is, parasitic modes of vibration of the suspended vibrating structures can be excited by shock or vibration leading to instability, malfunction, or impaired output signals.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a microelectromechanical systems (MEMS) device in the form of an angular rate sensor. The angular rate sensor includes two movable masses that serve as drive masses which are operated in antiphase oscillation. The two movable masses also serve as sense masses in which the sense electrodes are located below the movable masses. Couple springs connect the movable masses to allow both drive and sense motion while limiting low frequency parasitic common mode frequencies so that in-phase motion may be effectively rejected. Further, the movable masses are suspended by spring systems that are configured such that the drive and sense frequencies can be adjusted independent of one another and to push parasitic modes of vibration to higher frequencies. The higher frequencies of the parasitic modes of vibration are more difficult to excite, thereby reducing the potential for instability, malfunction, or impaired output signals of the angular rate sensor due to shock or vibration. Accordingly, various inventive concepts and principles embodied in the MEMS device enable it to operate reliably in the presence of shock and vibration. Although a MEMS angular rate sensor is described, it should be understood that features described herein may be adapted for use in other MEMS devices implementing movable masses for which parasitic modes of vibration are to be suppressed.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
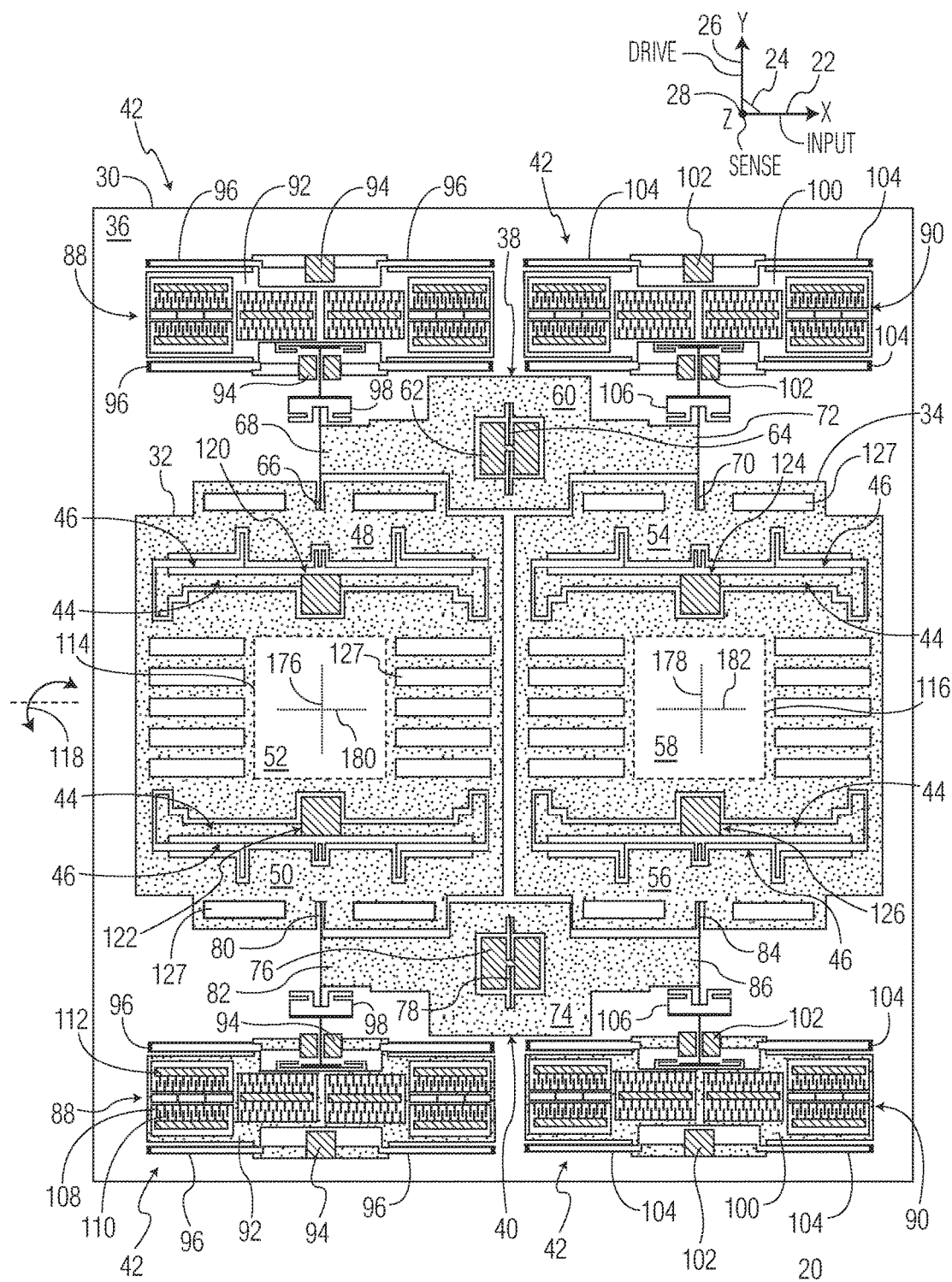
FIG. 1 shows a top view of a microelectromechanical systems (MEMS) device in accordance with an embodiment.

Referring to FIG. 1, FIG. 1 shows a top view of a MEMS device 20 in accordance with an embodiment. MEMS device 20 is generally configured to sense angular rate about an axis of rotation, i.e., the X-axis in a three-dimensional coordinate system, referred to herein as an input axis 22. Accordingly, MEMS device 20 is referred to herein as a gyro sensor 20. By convention, gyro sensor 20 is illustrated as having a generally planar structure within an X-Y plane 24, wherein a Y-axis 26 extends upwardly and downwardly in FIG. 1, and a Z-axis 28 extends out of the page (normal to X-Y plane 24 in FIG. 1) of the coordinate system.

Gyro sensor 20 generally includes a planar substrate 30, first and second movable masses 32, 34 resiliently suspended above a surface 36 of substrate 30, a first couple spring structure 38, a second couple spring structure 40, a drive system 42, suspension structures 44, and spring systems 46. More particularly, first movable mass 32 includes a first end region 48 laterally displaced away from a second end region 50 with a first central region 52 interposed between first and second end regions 48, 50. Likewise, second movable mass 34 includes a third end region 54 laterally displaced away from a fourth end region 56 with a second central region 58 interposed between third and fourth end regions 54, 56.

In general, first and second couple spring structures 38, 40 interconnect first movable mass 32 with second movable mass 34. First couple spring structure 38 includes a stiff beam 60 coupled to surface 36 of substrate 30 via a first beam anchor 62. A torsion member 64 is interconnected between stiff beam 60 and first beam anchor 62. A first elastic element 66 is coupled between a first beam end 68 of stiff beam 60 and first end region 48 of first movable mass 32. A second elastic element 70 is coupled between a second beam end 72 of stiff beam 60 and third end region 54 of second movable mass 34. Similarly, second couple spring structure 40 includes a stiff beam 74 coupled to surface 36 of substrate 30 via a second beam anchor 76. A torsion member 78 is interconnected between stiff beam 74 and second beam anchor 76. A third elastic element 80 is coupled between a third beam end 82 of stiff beam 74 and second end region 50 of first movable mass 32. A fourth elastic element 84 is coupled between a fourth beam end 86 of stiff beam 74 and fourth end region 56 of second movable mass 34. For consistency throughout the description of the following figures, any anchoring structures, such as beam anchors 62, 76, that connect an element of gyro sensor 20 to the underlying surface 36 of substrate 30 is illustrated with rightwardly and downwardly directed wide hatching. Conversely, any elements that are not anchoring structures do not include this rightwardly and downwardly directed wide hatching and are therefore suspended above surface 36 of substrate 30.

Drive system 42 is laterally displaced away from first and second movable masses 32, 34 and operably communicates with each of first and second movable masses 32, 34. More specifically, drive system 42 includes two drive elements 88 configured to oscillate first movable mass 32 and two drive elements 90 configured to oscillate second movable mass 34. Frame structures 92 of drive elements 88 are suspended above surface 36 of substrate 30 via anchor elements 94 and intervening elastic members 96. Additionally, frame structures 92 are interconnected with respective first and third beam ends 68, 82 of stiff beams 60, 74 via elastic members 98. Likewise, frame structures 100 of drive elements 90 are suspended above surface 36 of substrate 30 via anchor elements 102 and intervening elastic members 104. Additionally, frame structures 100 are interconnected with respective second and fourth beam ends 72, 86 of stiff beams 60, 74 via elastic members 106.

Drive system 42 includes sets of drive elements configured to oscillate first and second movable masses 32, 34. The drive elements includes pairs of electrodes, typically referred to as comb fingers 108, 110. In the illustrated example, comb fingers 108 are coupled to frame structures 92, 100 and are thus coupled to first and second movable masses 32, 34 via the respective elastic members 98, 106 and couple spring structures 38, 40. Comb fingers 110 are fixed to surface 36 of substrate 30 via anchors 112. Comb fingers 110 are spaced apart from and positioned in alternating arrangement with comb fingers 108. By virtue of their attachment to frame structures 92, 100, couple spring structures 38, 40, and movable masses 32, 34, comb fingers 108 are movable together with first and second movable masses. Conversely, due to their fixed attachment to substrate 30, comb fingers 110 are stationary relative to comb fingers 108. Accordingly, comb fingers 108 are referred to herein as movable fingers 108, and comb fingers 110 are referred to herein as fixed fingers 110. Only a few movable and fixed fingers 108, 110 are shown for clarity of illustration. Those skilled in the art should readily recognize that the quantity and structure of the comb fingers will vary in accordance with design requirements.

First and second movable masses 32, 34 are configured to undergo oscillatory motion within X-Y plane 24. In general, an alternating current (AC) voltage may be applied to fixed fingers 110 via a drive circuit (not shown) to cause first and second drive masses 32, 34 to linearly oscillate in a direction of motion substantially parallel to Y-axis 26. As such, Y-axis 26 is alternatively referred to herein as drive axis 26. In an embodiment, the AC voltage is suitably applied to fixed fingers 110 to cause movable fingers 108 (and thus first and second movable masses 32, 34) to move generally parallel to fixed fingers 110. The linkage of first and second movable masses 32, 34 via first and second couple spring structures 38, 40 (that include the various elastic elements 66, 70, 80, 84 functioning cooperatively) enables drive motion of movable masses 32, 34 in opposite directions, i.e., phase opposition, along drive axis 26, i.e., the Y-axis, while effectively rejecting in-phase (common mode) motion.

Further, as will be discussed in greater detail in connection with FIG. 5, torsion members 64, 78 of respective first and second couple spring structures 38, 40 enable teeter totter motion of stiff beams 60, 74 to enable first and second movable masses 32, 34 to move in opposite directions, i.e., phase opposition, in response sense motion of first and second movable masses 32, 34. In particular, the sense motion of first and second movable masses 32, 34 is a parallel plate sense motion aligned with an axis, i.e. Z-axis 28, perpendicular to surface 36 of substrate 30. Thus, Z-axis 28 is alternatively referred to herein as sense axis 28. Parallel plate sense motion refers to the movement of first and second movable masses 32, 34 in which their surface area remains generally parallel to surface 36 of substrate 30 as they oscillate along sense axis 28. Such parallel plate motion of first and second movable masses 32, 34 can effectively result in enhanced sensitivity of gyro sensor 20 to an angular stimulus.

A sense electrode 114 may be formed on surface 36 of substrate 30 underlying first central region 52 of first movable mass 32 and another sense electrode 116 may be formed on surface 36 of substrate 30 underlying second central region 58. Sense electrodes 114, 116 are obscured by respective first and second movable masses 32, 34 in the top view image of FIG. 1. Thus, sense electrodes 114, 116 are shown in dashed line form therein. In general, while first and second movable masses 32, 34 are driven in phase opposition along drive axis 26, first and second movable masses 32, 34 are configured to undergo parallel plate, out-of-plane motion along sense axis 28 in response to an external angular stimulus 118 on gyro sensor 20. This out-of-plane sense motion of first and second movable masses 32, 34 is due to the Coriolis forces acting on first and second movable masses 32, 34. As first and second movable masses 32, 34 undergo the oscillatory, parallel plate sense motion, the position change is sensed as changes in capacitance by sense electrodes 114, 116. This change in capacitance can be processed electronically in a conventional manner to determine the magnitude of the angular stimulus (i.e., the angular rate) of gyro sensor 20 about input axis 22.

Now with further regard to the structure of first and second movable masses 32, 34, first movable mass 32 includes a first opening 120 extending through first end region 48 and a second opening 122 extending through second end region 50. Likewise, second movable mass 34 includes a third opening 124 extending through third end region 54 and a fourth opening 126 extending through fourth end region 56. Additional slots 127 may extend through first and second movable masses 32, 34 at any suitable location. Although not shown for clarity, electrodes fixed to the underlying substrate may be located in slots 127 for the purpose of providing electrostatic force in order to, for example, compensate for quadrature error.

Figure 2:
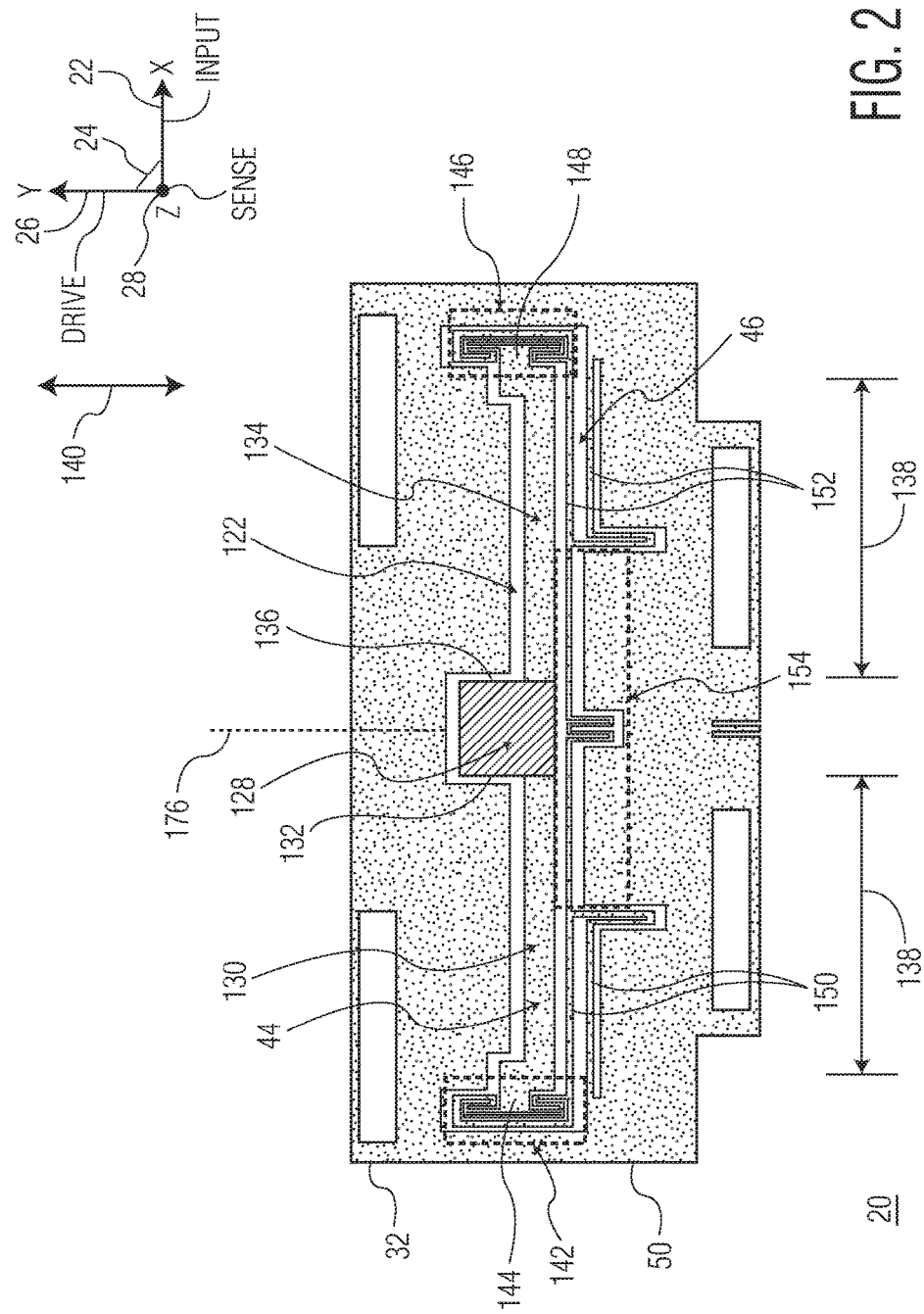
FIG. 2 shows an enlarged top view of a portion of the MEMS device of FIG. 1, particularly including a suspension structure and a spring system of the MEMS device.

Referring now to FIG. 2 in connection with FIG. 1, FIG. 2 shows an enlarged top view of a portion of gyro sensor 20 particularly including one of the suspension structures 46 and spring systems 48 of gyro sensor 20. This enlarged top view is provided to more clearly distinguish structural features of gyro sensor 20 that may not otherwise be visible in the top view illustration of FIG. 1. Accordingly, FIG. 2 shows a top view of second end region 50 of first movable mass 32 including one of suspension structures 44 and one of spring systems 46 located in second opening 122. It should be understood that the following discussion applies equivalently to suspension structure 44 and spring system 46 located in first opening 120 at first end region 48 of first movable mass 32. Likewise, the following discussion applies equivalently to suspension structure 44 and spring system 46 located in third opening 124 at third end region 54 of second movable mass 34, as well as to suspension structure 44 and spring system 46 located in fourth opening 126 at fourth end region 56 of second movable mass 34.

Suspension structure 44 located in second opening 122 includes an anchor 128 coupled to surface 36 (FIG. 1) of substrate 30. The remaining elements of suspension structure 44 are therefore suspended above surface 36 of substrate 30 via anchor 128. A first rigid link 130 is coupled to and extends from a first side 132 of anchor 128. Likewise, a second rigid link 134 is coupled to and extends from a second side 136 of anchor 128. Each of first and second rigid links 130, 134 has a lengthwise dimension 138 oriented substantially perpendicular to a drive direction 140 of first movable mass 32, where drive direction 140 is parallel to drive axis 26.

Spring system 46 located in second opening 122 includes a first spring head 142 (delineated by a dashed line box) coupled to a first end 144 of first rigid link 130 and a second spring head 146 (delineated by a dashed line box) coupled to a second end 148 of second rigid link 134. Spring system 46 further includes a first drive spring 150 coupled to first spring head 142 and coupled to first movable mass 32. Similarly, spring system 46 includes a second drive spring 152 coupled to second spring head 146 and coupled to first movable mass 32. A connection spring 154 (delineated by a dashed line box) connects first drive spring 150 with second drive spring 152. Spring system 46 is also suspended above surface 36 of substrate 30 via its connections to suspension structure 44 and to first movable mass 32.

First and second drive springs 150, 152 exhibits high cross axis stiffness in multiple directions, thus pushing the undesirable parasitic modes of vibrations to higher frequencies. Additionally, connection spring 154 interconnecting first and second drive springs 150, 152 also serves to push the undesirable parasitic modes to higher frequencies. These higher frequencies of these parasitic modes are harder to excite, thereby enhancing the robustness of gyro sensor 20 to shock and vibration.

Figure 3:
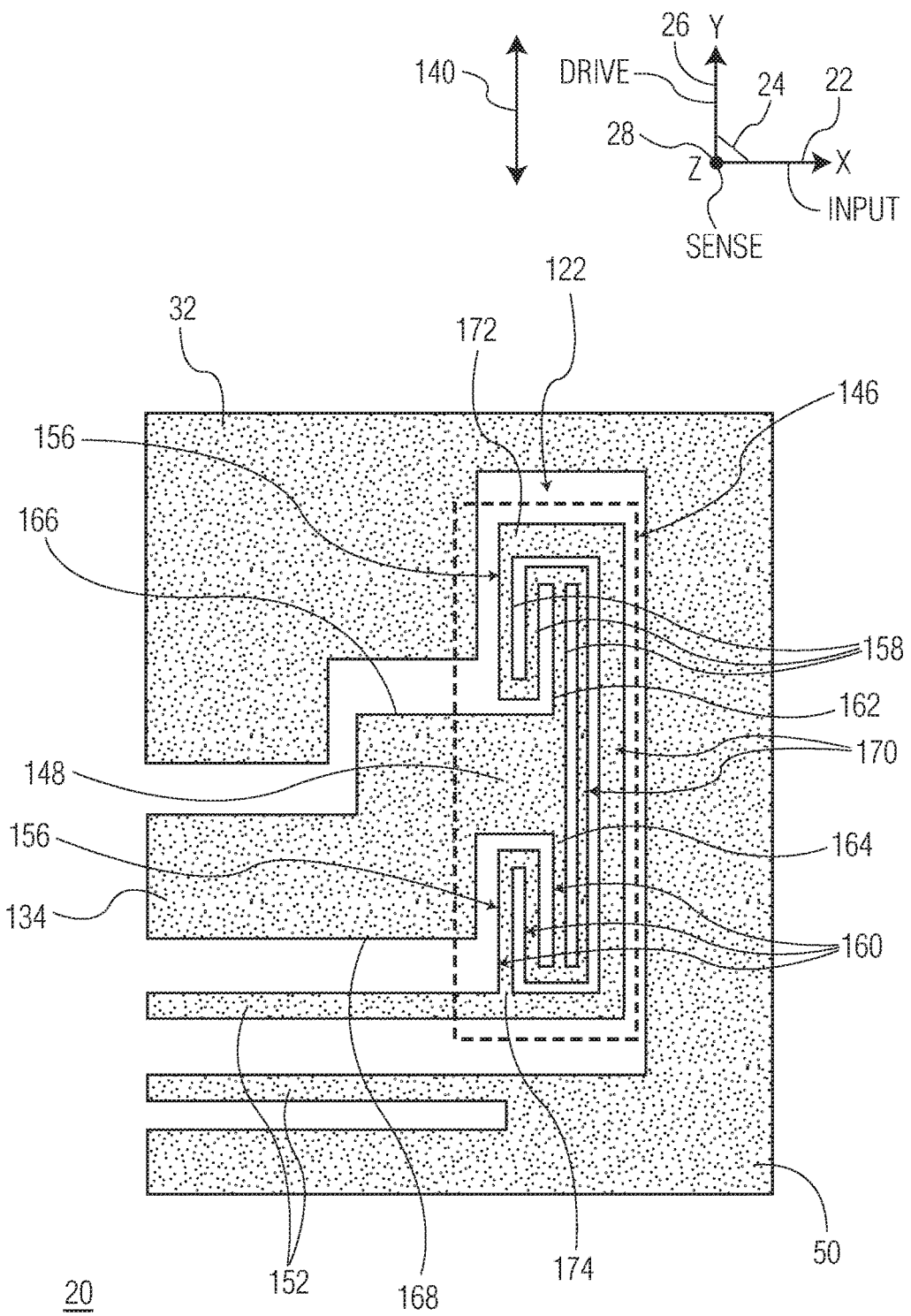
FIG. 3 shows an enlarged top view of a portion of the MEMS device, particularly including a spring head of the spring system of FIG. 2.

Referring now to FIG. 3 in connection with FIGS. 1 and 2, FIG. 3 shows an enlarged top view of a portion of gyro sensor 20, particularly including a spring head of the spring system of FIG. 2. This enlarged top view is provided to more clearly distinguish structural features of the spring head of gyro sensor 20 that may otherwise be less visible in the illustration of FIG. 2. Accordingly, FIG. 3 shows a top view of second end region 50 of first movable mass 32 including second spring head 146 located in second opening 122. Again, it should be understood that the following discussion applies equivalently to first spring head 142 in second opening 122, as well as to each of the first and second spring heads 142, 146 of each of spring systems 46 located in first, third, and fourth openings 120, 124, 126.

Second spring head 146 includes a torsion beam 156 interconnected between second end 148 of second rigid link 134 and second drive spring 152, and configured to enable rotation about an axis substantially parallel to drive axis 26. In this illustrated configuration, torsion beam 156 includes a first torsion beam section 158 generally aligned with drive axis 26 and a second torsion beam section 160 generally aligned with drive axis 26. Each of first and second torsion beam sections 158, 160 has a first beam end 162, 164 coupled to and extending from opposing lengthwise edges 166, 168 of second rigid link 134. At least one rigid connection bar 170 (two shown), aligned with drive axis 26, interconnects a second beam end 172, 174 of each of first and second torsion beam sections 158, 160.

Connection bars 170 are implemented to effectively set (e.g., increase) a drive frequency of first and second movable masses 32, 34. Additionally, each of first and second torsion beam sections 158, 160 are folded beam springs, also known as meander springs, in the illustrated embodiment. The folded beam configuration is implemented to effectively set a sense frequency of first and second movable masses 32, 34. Hence, the configuration of spring heads 142, 146 allows parallel plate sense motion of first and second movable masses 32, 34 while increasing the drive stiffness. Accordingly, the configuration of spring heads 142, 146 enables independent adjustment of the drive and sense frequency.

With continued reference to FIGS. 1-3, each of first and second movable masses 32, 34 are characterized by a midline 176, 178, respectively (see especially FIG. 1), that is substantially parallel to drive direction 140, i.e., parallel to drive axis 26. Anchor 128 of each of suspension systems 44 associated with first movable mass 32 is located at midline 176 with first and second rigid links 130, 134 being arranged on opposing sides of midline 176 and first spring head 142 and first drive spring 150 being arranged in mirror symmetry with second spring head 144 and second drive spring 152 relative to midline 176. Similarly, anchor 128 of each of suspension systems 44 associated with second movable mass 34 is located at midline 178 with first and second rigid links 130, 134 being arranged on opposing sides of midline 178, and first spring head 142 and first drive spring 150 being arranged in mirror symmetry with second spring head 144 and second drive spring 152 relative to midline 178. Thus, midline 176 is an axis of mirror symmetry of first movable mass 32 and midline 178 is an axis of mirror symmetry for second movable mass 34. An axis of mirror symmetry is one in which if a shape were to be folded in half at the axis, the two halves of the shape would be identical, i.e., the two halves are each other's mirror images.

Still further, each of first and second movable masses 32, 34 is characterized by a transverse midline 180, 182, respectively (see especially FIG. 1), that is parallel to surface 36 of substrate 30 but is perpendicular to drive direction. Thus, transverse midlines 180, 182 are substantially parallel to input axis 22, i.e., the X-axis. Suspension structure 44 and spring system 46 at first end region 48 of first movable mass 32 are arranged in mirror symmetry with suspension structure 44 and spring system 46 at second end region 50 of first movable mass 32 relative to transverse midline 180. Similarly, suspension structure 44 and spring system 46 at third end region 54 of second movable mass 34 are arranged in mirror symmetry with suspension structure 44 and spring system 46 at fourth end region 56 of second movable mass 34 relative to transverse midline 182.

The symmetric construct of the elements of gyro sensor 20 along with two centrally located anchors 128 for each of first and second movable masses 32, 34 which are connected via first and second rigid links 130, 134 to spring systems 46 effectively reduces the sensitivity of gyro sensor 20 to package stress. Further, the symmetric construct of the elements of gyro sensor 20 enable both drive and sense motion of first and second movable masses 32, 34 in enhanced movement accuracy and sensitivity.

Figure 4:
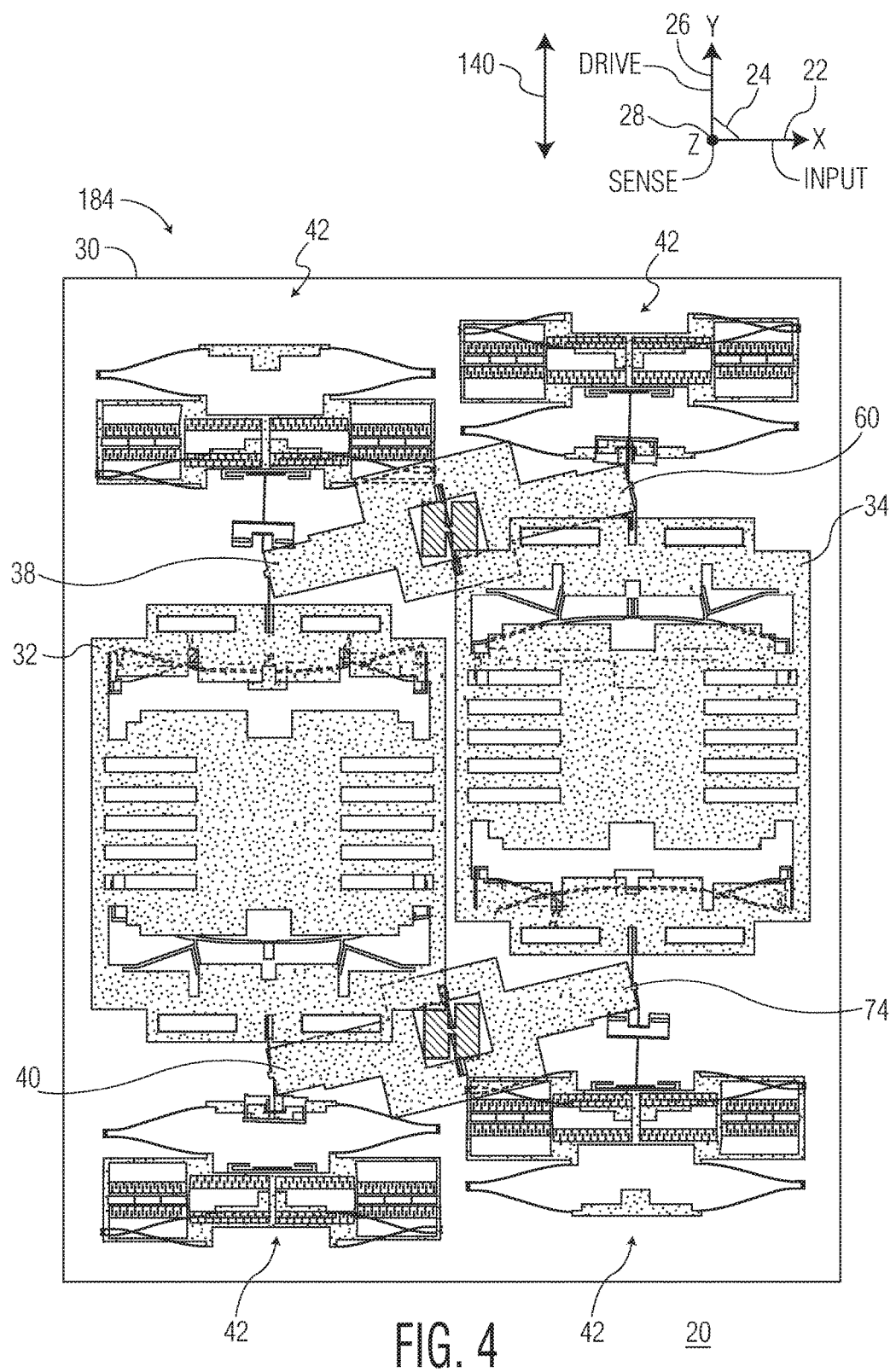
FIG. 4 shows a top view of the MEMS device of FIG. 1 in a drive mode.

Referring now to FIG. 4, FIG. 4 shows a simplified top view of gyro sensor 20 in a drive mode 184. The structure of first and second couple spring structures 38, 40 enables their respective stiff beams 60, 74 to pivot in X-Y plane in response to oscillatory linear drive motion 140 imparted on first and second movable masses 32, 34 via drive system 42. Thus the configuration of first and second couple spring structures 38, 40 with the various interconnecting elastic elements results in a substantially linear oscillation of first and second movable masses 32, 34 in opposite directions (phase opposition) approximately parallel to drive axis 26 (i.e., the Y-axis). Common mode excitation (e.g., shock, vibration, etc.), which would typically tend to move first and second movable masses 32, 34 by the same amount and in the same direction along drive axis 26 is counteracted by the constraint of stiff beams 60, 74 of first and second couple spring structures 38, 40 to substrate 30. Accordingly, common mode excitation (i.e., in-phase motion) of first and second movable masses 32, 34 at the drive frequency is largely rejected.

Figure 5:
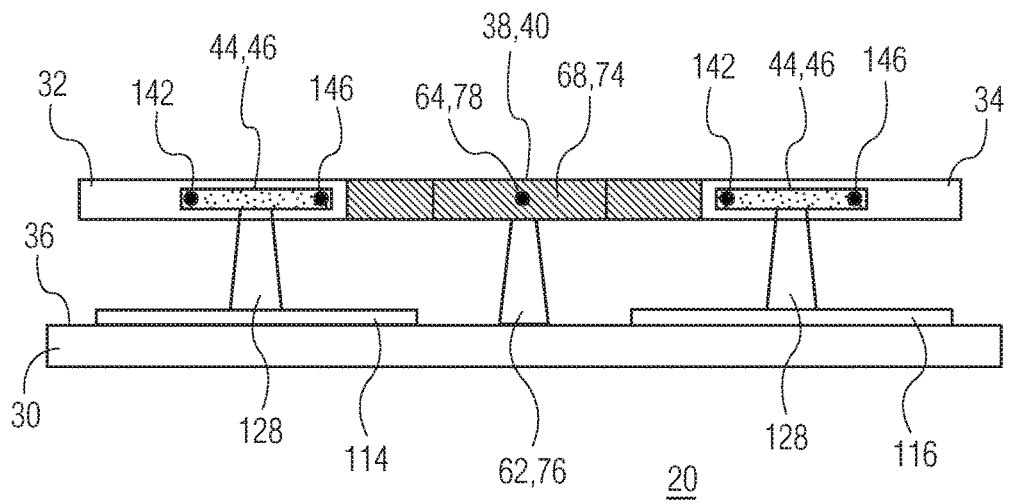
FIG. 5 shows a stylized side view of the MEMS device of FIG. 1 that has not yet been subjected to an angular stimulus.
Figure 6:
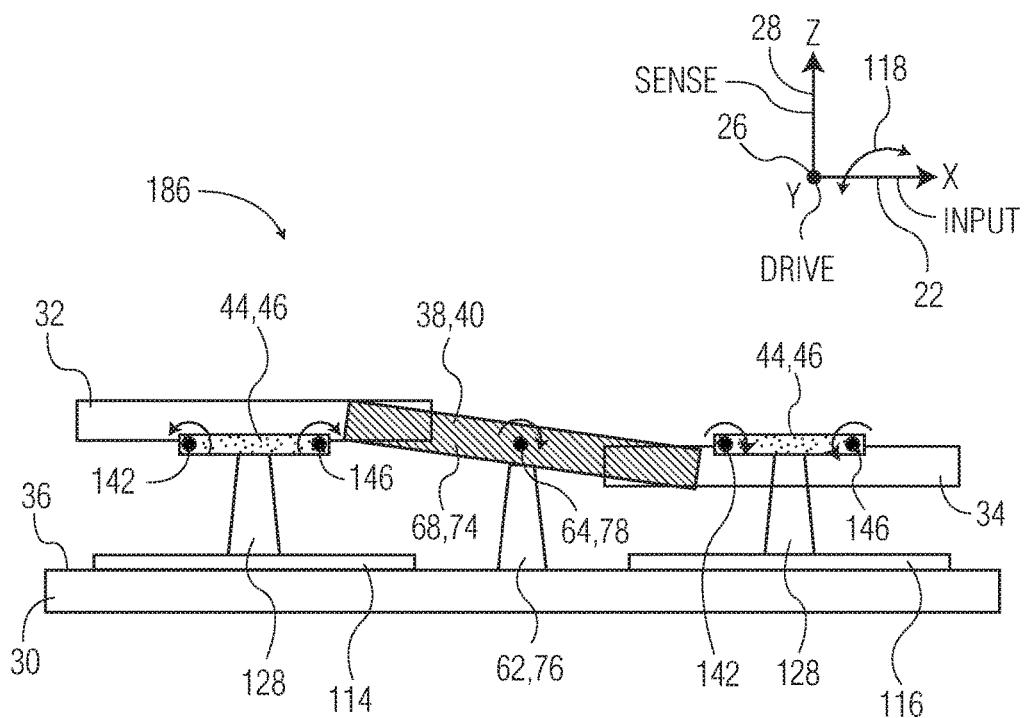
FIG. 6 shows the stylized side view of the MEMS device of FIG. 5 in a sense mode.

Referring to FIGS. 5 and 6, FIG. 5 shows a stylized side view of gyro sensor 20 that has not yet been subjected to angular stimulus 118 and FIG. 6 shows the stylized side view of gyro sensor 20 in a sense mode 186. In each of FIGS. 5 and 6 so as to distinguish the various elements that are able to move relative to one another in response to angular stimulus, first and second movable masses 32, 34 are represented by white rectangles, first and second couple spring structures 38, 40 are represented by a rectangle having rightwardly and downwardly directed narrow hatching, and the combined structure of suspension structures and spring structures 44, 46 are represented by a rectangle having a stippled patterned.

As shown, first and second movable masses 32, 34 are suspended above surface 36 of substrate 30 via anchors 128 of suspension structures 44. Similarly, first and second stiff beams 60, 74 of first and second couple spring structures 38, 40 are suspended above surface 36 of substrate 30 via beam anchors 62, 76. Torsion members 64, 78 of first and second couple spring structures 38, 40 are represented by solid black circles. Likewise, first and second spring heads 142, 146 are represented by solid black circles. Sense electrodes 114, 116 on substrate 30 underlie respective first and second movable masses 32, 34.

In response to angular stimulus 118 about input axis 22, torsion members 64, 78 interconnected between respective stiff beams 68, 74 and beam anchors 62, 76 enable teeter totter motion of stiff beams 68, 74. Additionally, torsion beams 156 (FIG. 3) of first and second spring heads 142, 146 rotate about an axis that is oriented substantially parallel to the drive direction, i.e., parallel to drive axis 26. In these illustrations, drive axis 26 extends outwardly from the page. Thus, the axes of rotation for spring heads 142, 146 are represented by their respective black circles. The various connections described above, but not shown in the stylized views of FIGS. 5 and 6, cause second movable mass 34 to move in phase opposition to first movable mass 32 as shown in the sense mode 186 of FIG. 6. Moreover, the sense motion of first and second movable masses 32, 34 is a parallel plate sense motion aligned with sense axis 28, perpendicular to surface 36 of substrate 30.

Only drive and sense modes of vibration frequencies (drive frequency and sense frequency) are needed to fulfill the functionality of gyro sensor 20. Any modes that exist besides the drive and sense modes are undesirable and are therefore referred to herein as parasitic modes of vibrations. The parasitic modes of vibration can potentially be harmful for proper device operation because all modes of vibration can be stimulated by external disturbances (e.g., shock and vibration) leading to a malfunction of a gyro sensor. Therefore, parasitic modes can tend to impair the vibration robustness of a gyro sensor design. The parasitic modes of vibration can be classified regarding their severity into "common modes" and "other parasitic modes." Common modes are based on common-phase motions of structural features. Common modes are critical because they can be easily stimulated by external disturbances like shock or vibration. Other parasitic modes are based on rotatory or anti-phase motions that are more difficult to stimulate by these external disturbances.

In operation, first and second movable masses 32, 34 may be driven in phase opposition (antiphase) parallel to drive axis 26 at a drive frequency of approximately 18.4 kHz. In response to angular stimulus 118, first and second movable masses 32, 34 exhibit parallel plate motion along sense axis 28 at a sense frequency of approximately 19.4 kHz. The configuration of first and second couple spring structures 38, 40, suspension structures 44, and spring systems 46 can serve to reduce the number of parasitic modes in the frequency range of the drive and sense frequencies and/or increase the vibration frequencies of the parasitic modes. For example, the number of parasitic modes may be reduced from as many as eleven parasitic modes in some prior art designs to four parasitic modes. Further, the lowest common mode vibration frequency of the remaining parasitic modes may be approximately 44.5 kHz in this configuration. A reduced number of parasitic modes in a particular frequency range can reduce the potential for an external disturbance to stimulate first and second movable masses 32, 34 which results in an increased robustness of gyro sensor 20 to shock and vibration. Further, the remaining parasitic modes with higher frequencies relative to the drive and sense frequencies are more difficult to excite as the energy spectral density of real world disturbing shocks or vibrations tend to decrease with increased frequencies leading to a reduced excitation of gyro sensor 20 at these higher frequencies.

Thus, a microelectromechanical systems (MEMS) device in the form of an angular rate sensor is disclosed herein. An embodiment of a MEMS device comprises a substrate, a movable mass having an end region laterally displaced away from a central region of the movable mass, wherein an opening extends through the end region, and a suspension structure located in the opening. The suspension structure includes an anchor coupled to a surface of the substrate, a first rigid link coupled to and extending from a first side of the anchor, and a second rigid link coupled to and extending from a second side of the anchor, each of the first and second rigid links having a lengthwise dimension oriented perpendicular to a drive direction of the movable mass, the drive direction being substantially parallel to the surface of the substrate. A spring system is located in the opening. The spring system includes a first spring head coupled to a first end of the first rigid link, a second spring head coupled a second end of the second rigid link, a first drive spring coupled to the first spring head and coupled to the movable mass, and a second drive spring coupled to the second spring head and coupled to the movable mass, wherein the movable mass is resiliently suspended above the surface of the substrate via the suspension structure and the spring system, the spring system enables drive motion of the movable mass in the drive direction and enables sense motion of the movable mass in a sense direction that is perpendicular to the surface of the substrate.

The embodiments described herein reduce the number of parasitic modes of vibration and push the remaining parasitic modes of vibration to higher frequencies in, for example, a MEMS gyro sensor. The higher frequencies of the parasitic modes of vibration are more difficult to excite, thereby reducing the potential for instability, malfunction, or impaired output signals of the angular rate sensor due to shock or vibration. Accordingly, various inventive concepts and principles embodied in the MEMS device enable it to operate reliably in the presence of shock and vibration.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A microelectromechanical systems (MEMS) device comprising:
   a substrate;
   a movable mass having an end region laterally displaced away from a central region of said movable mass, wherein an opening extends through said end region;
   a suspension structure located in said opening, said suspension structure including an anchor coupled to a surface of said substrate, a first rigid link coupled to and extending from a first side of said anchor, and a second rigid link coupled to and extending from a second side of said anchor, each of said first and second rigid links having a lengthwise dimension oriented perpendicular to a drive direction of said movable mass, said drive direction being substantially parallel to said surface of said substrate; and
   a spring system located in said opening, said spring system including:
      a first spring head coupled to a first end of said first rigid link;
      a second spring head coupled a second end of said second rigid link;
      a first drive spring coupled to said first spring head and coupled to said movable mass; and
      a second drive spring coupled to said second spring head and coupled to said movable mass, wherein said movable mass is resiliently suspended above said surface of said substrate via said suspension structure and said spring system, said spring system enables drive motion of said movable mass in said drive direction and enables sense motion of said movable mass in a sense direction that is perpendicular to said surface of said substrate.

2. The MEMS device of claim 1 wherein said movable mass in characterized by a midline that is substantially parallel to said drive direction, said anchor is located at said midline of said movable mass, said first and second rigid links are arranged on opposing sides of said midline, and said first spring head and said first drive spring are arranged in mirror symmetry with said second spring head and said second drive spring relative to said midline.

3. The MEMS device of claim 1 wherein each of said first and second spring heads comprises a torsion beam configured to enable rotation about an axis oriented substantially parallel to said drive direction.

4. The MEMS device of claim 3 wherein said torsion beam comprises:
   a first torsion beam section aligned with said axis;
   a second torsion beam section aligned with said axis, said first and second torsion beam sections having a first beam end coupled to and extending from opposing lengthwise edges of a respective one of said first and second rigid links; and
   a connection bar aligned with said axis and interconnecting a second beam end of each of said first and second torsion beam sections.

5. The MEMS device of claim 1 wherein said spring system further comprises a connection spring connecting said first drive spring with said second drive spring.

6. The MEMS device of claim 1 wherein said end region is a first end region, said opening is a first opening, said suspension structure is a first suspension structure, said spring system is a first spring system, and:
   said movable mass has a second end region laterally displaced away from said first end region with said central region interposed between said first and second end regions, wherein a second opening extends through said second end region; and
   said MEMS device further comprises:
      a second suspension structure located in said second opening, said second suspension structure including a second anchor coupled to said surface of said substrate, a third rigid link coupled to and extending from a third side of said second anchor, and a fourth rigid link coupled to and extending from a fourth side of said second anchor, each of said third and fourth rigid links having said lengthwise dimension oriented perpendicular to said drive direction of said movable mass; and a second spring system located in said second opening, said second spring system including a third spring head coupled to a third end of said third rigid link, a fourth spring head coupled a fourth end of said fourth rigid link, a third drive spring coupled to said third spring head and coupled to said movable mass, a fourth drive spring coupled to said fourth spring head and coupled to said movable mass.

7. The MEMS device of claim 6 wherein said movable mass is characterized by a midline that is substantially parallel to said surface of said substrate and perpendicular to said drive direction, and wherein said second suspension structure and said second spring system are arranged in mirror symmetry with said first suspension structure and said first spring system.

8. The MEMS device of claim 6 wherein said movable mass is characterized by a midline that is substantially parallel to said drive direction, each of said first and second anchors is located at said midline of said movable mass, said first and second rigid links are arranged on opposing sides of said midline, said first spring head and said first drive spring are arranged in mirror symmetry with said second spring head and said second drive spring relative to said midline, said third and fourth rigid links are arranged on said opposing sides of said midline, and said third spring head and said third drive spring are arranged in mirror symmetry with said fourth spring head and said fourth drive spring relative to said midline.

9. The MEMS device of claim 1 further comprising a sense electrode formed on said surface of said substrate underlying said central region of said movable mass.

10. The MEMS device of claim 1 wherein said movable mass is a first movable mass, and said MEMS device further comprises:
a second movable mass resiliently suspended above said surface of said substrate adjacent to said first movable mass;
a couple spring structure having a stiff beam coupled to said surface of said substrate via a beam anchor, said couple spring structure interconnecting said first movable mass with said second movable mass, a second lengthwise dimension of said stiff beam being oriented perpendicular to said drive direction, said couple spring structure being configured to pivot about an axis that is substantially perpendicular to said surface of said substrate in response to said drive motion of said first and second movable masses.

11. The MEMS device of claim 10 wherein said couple spring structure further comprises:
a first elastic element coupled between a first beam end of said stiff beam and said first movable mass; and
a second elastic element coupled between a second beam end of said stiff beam and said second movable mass, said first and second elastic elements being oriented transverse to said stiff beam, said first and second elastic elements functioning cooperatively with said stiff beam to enable said first and second movable masses to move in phase opposition with one another in response to said drive motion.

12. The MEMS device of claim 10 wherein said couple spring structure further comprises a torsion member interconnected between said stiff beam and said beam anchor, said torsion member enabling teeter totter motion of said stiff beam about an axis aligned with said torsion member in response to said sense motion of said first and second movable masses.

13. The MEMS device of claim 12 wherein said torsion member is configured to enable parallel plate motion of first and said movable masses in phase opposition with one another in response to said sense motion.

14. The MEMS device of claim 10 wherein:
said first movable mass has a second end region laterally displaced away from said first end region with said central region interposed between said first and second end regions;
said second movable mass has a third end region laterally displaced away from a fourth end region with a second central region interposed between said third and fourth end regions;
said couple spring structure is a first couple spring structure coupled to each of said first and third end regions of respective first and second movable masses; and
said MEMS device further comprises a second couple spring structure having a second stiff beam coupled to said surface of said substrate via a second beam anchor, said second couple spring structure interconnecting said second end of said first movable mass with said fourth end of said second movable mass, said second couple spring structure being configured to pivot about a second axis that is substantially perpendicular to said surface of said substrate in response to said drive motion of said first and second movable masses.

15. A microelectromechanical systems (MEMS) device comprising:
a substrate;
a movable mass having a first end region laterally displaced away from a second end region with a central region interposed between said first and second end regions, wherein a first opening extends through said first end region and a second opening extends through said second end region;
a first suspension structure located in said first opening, said first suspension structure including a first anchor coupled to a surface of said substrate, a first rigid link coupled to and extending from a first side of said first anchor, and a second rigid link coupled to and extending from a second side of said first anchor, each of said first and second rigid links having a lengthwise dimension oriented perpendicular to a drive direction of said movable mass, said drive direction being substantially parallel to said surface of said substrate;
a first spring system located in said first opening, said first spring system including a first spring head coupled to a first end of said first rigid link, a second spring head coupled a second end of said second rigid link, a first drive spring coupled to said first spring head and coupled to said movable mass, and a second drive spring coupled to said second spring head and coupled to said movable mass;
a second suspension structure located in said second opening, said second suspension structure including a second anchor coupled to said surface of said substrate, a third rigid link coupled to and extending from a third side of said second anchor, and a fourth rigid link coupled to and extending from a fourth side of said second anchor, each of said third and fourth rigid links having said lengthwise dimension oriented perpendicular to said drive direction of said movable mass; and
a second spring system located in said second opening, said second spring system including a third spring head coupled to a third end of said third rigid link, a fourth spring head coupled a fourth end of said fourth rigid link, a third drive spring coupled to said third spring head and coupled to said movable mass, a fourth drive spring coupled to said fourth spring head and coupled to said movable mass, each of said first, second, third, and fourth spring heads including a torsion beam configured to enable rotation about an axis oriented substantially parallel to said drive direction, wherein said movable mass is resiliently suspended above said surface of said substrate via said first and second suspension structures and said first and second spring systems, said first and second spring systems enabling drive motion of said movable mass in said drive direction and enabling sense motion of said movable mass in a sense direction that is perpendicular to said surface of said substrate.

16. The MEMS device of claim 15 wherein said torsion beam comprises:
a first torsion beam section aligned with said axis;
a second torsion beam section aligned with said axis, said first and second torsion beams having a first beam end coupled to and extending from opposing lengthwise edges of a respective one of said first, second, third, and fourth rigid links; and
a connection bar aligned with said axis and interconnecting a second beam end of each of said first and second torsion beam sections.

17. The MEMS device of claim 1 wherein:
said first spring system further comprises a first connection spring connecting said first drive spring with said second drive spring; and
said second spring system further comprises a second connection spring connecting said third drive spring with said fourth drive spring.

18. A microelectromechanical systems (MEMS) device comprising:
a substrate;
a first movable mass having a first end region laterally displaced away from a second end region with a first central region interposed between said first and second end regions, wherein a first opening extends through said first end region and a second opening extends through said second end region;
a second movable mass having a third end region laterally displaced away from a fourth end region with a second central region interposed between said third and fourth end regions, wherein a third opening extends through said third end region and a fourth opening extends through said fourth end region;
suspension structures located in each of said first, second, third, and fourth openings, each of said suspension structures including an anchor coupled to a surface of said substrate, a first rigid link coupled to and extending from a first side of said first anchor, and a second rigid link coupled to and extending from a second side of said first anchor, each of said first and second rigid links having a lengthwise dimension oriented perpendicular to a drive direction of said movable mass, said drive direction being substantially parallel to said surface of said substrate;
spring systems located in each of said first, second, third, and fourth openings, each of said first spring systems including a first spring head coupled to a first end of said first rigid link, a second spring head coupled a second end of said second rigid link, a first drive spring coupled to said first spring head and coupled to an associated one of said first and second movable masses, and a second drive spring coupled to said second spring head and said associated one of said first and second movable masses; and
a couple spring structure having a stiff beam coupled to said surface of said substrate via a beam anchor, said couple spring structure interconnecting said first movable mass with said second movable mass, a second lengthwise dimension of said stiff beam being oriented perpendicular to said drive direction, wherein said first and second movable masses are resiliently suspended above said surface of said substrate via said suspension structures and said spring systems, said spring systems enable drive motion of said movable mass in said drive direction and enable sense motion of said first and second movable masses in a sense direction that is perpendicular to said surface of said substrate, and said couple spring structure is configured to pivot about an axis that is substantially perpendicular to said surface of said substrate in response to said drive motion of said first and second movable masses such that said first and second movable masses move in phase opposition with one another.

19. The MEMS device of claim 18 wherein said couple spring structure further comprises a torsion member interconnected between said stiff beam and said beam anchor, said torsion member enabling teeter totter motion of said stiff beam about an axis aligned with said torsion member in response to said sense motion of said first and second movable masses to enable parallel plate motion of first and said movable masses in phase opposition with one another in response to said sense motion.

20. The MEMS device of claim 10 wherein:
said couple spring structure is a first couple spring structure coupled to each of said first and third end regions of respective first and second movable masses; and
said MEMS device further comprises a second couple spring structure having a second stiff beam coupled to said surface of said substrate via a second beam anchor, said second couple spring structure interconnecting said second end of said first movable mass with said fourth end of said second movable mass, said second couple spring structure being configured to pivot about a second axis that is substantially perpendicular to said surface of said substrate in response to said drive motion of said first and second movable masses.

* * * * *